United States Patent
Tsutsumi et al.

(12)

(10) Patent No.: US 6,723,485 B1
(45) Date of Patent: Apr. 20, 2004

(54) POSITIVE RESIST COMPOSITION AND PROCESS FOR FORMING RESIST PATTERN USING SAME

(75) Inventors: Kentaro Tsutsumi, Saitama (JP); Michitaka Ootani, Saitama (JP); Kazuhiko Maeda, Tokyo (JP)

(73) Assignee: Central Glass Company, Limited, Yamaguchi (JP)

( * ) Notice: Subject to any disclaimer, the term of this patent is extended or adjusted under 35 U.S.C. 154(b) by 0 days.

(21) Appl. No.: 09/722,571

(22) Filed: Nov. 28, 2000

(30) Foreign Application Priority Data

Nov. 29, 1999 (JP) ............................................. 11-338701

(51) Int. Cl.$^7$ ............................. G03F 7/039; G03F 7/30
(52) U.S. Cl. ..................... 430/270.1; 430/170; 430/907
(58) Field of Search .............................. 430/170, 270.1, 430/907

(56) References Cited

U.S. PATENT DOCUMENTS

| 4,540,598 A | | 9/1985 | Berner et al. ............... 427/54.1 |
| 6,110,640 A | * | 8/2000 | Kawamura et al. ....... 430/270.1 |

FOREIGN PATENT DOCUMENTS

| DE | 195 25 221 | 1/1996 |
| EP | 0 843 218 | 5/1998 |
| JP | 60-65072 | 4/1985 |
| JP | 4-39665 | 2/1992 |
| JP | 8-82925 | 3/1996 |
| JP | 9-43848 | 2/1997 |

OTHER PUBLICATIONS

Delaire et al., "Effects of molecular weights and polydispersity on the properties of poly (trifluoroethyl methacrylate) as a positive x ray and electron resist", Journal of Vacuum Science & Technology, vol. 8, No. 1, Jan./Feb. 1990, pp. 33–38 (XP 000249776).

* cited by examiner

Primary Examiner—John S. Chu
(74) Attorney, Agent, or Firm—Crowell & Moring LLP

(57) ABSTRACT

A positive resist composition contains (a) an acrylic resin which is subject to a change in solubility in a basic aqueous solution, the acrylic resin comprising an acrylic or methacrylic acid ester unit comprising an ester moiety comprising a fluorine-containing group; and (b) a photoacid generator capable of releasing an acid when irradiated with a laser. The composition is high in transparency to vacuum ultraviolet laser beams, particularly the $F_2$ excimer laser beam, and high in sensitivity.

39 Claims, 1 Drawing Sheet

POSITIVE RESIST COMPOSITION AND PROCESS FOR FORMING RESIST PATTERN USING SAME

BACKGROUND OF THE INVENTION

The present invention relates to a positive resist composition, particularly to a chemically amplified positive resist composition, which is high in transparency to the vacuum ultraviolet laser, particularly to the $F_2$ excimer laser beam, and is high in sensitivity. The present invention further relates to a process for forming a resist pattern using the composition.

In recent years, resist compositions have been used in the production of semiconductor devices and liquid crystal devices. Particularly, a chemically amplified resist composition is a resist for utilizing the catalytic action of an acid formed by the irradiation of an activating energy ray. Such resist has high sensitivity and high resolution and makes it possible to reduce the amount of an compound (i.e., photoacid generator) for generating an acid by the irradiation of an activating energy ray. Such resist has two types, positive and negative types, and contains two basic components, a photoacid generator and a film-forming component that is subject to a change in solubility in an basic aqueous solution by the action of the acid generated.

Hitherto, a polyhydroxystyrene resin, of which a part of the hydroxyl groups is optionally protected by substituting solubility reducing groups capable of being dissociated in the presence of an acid, has widely been used as the film-forming component (resin component) of resist compositions, due to its high transparency to the KrF excimer laser beam (wavelength: 248 nm).

As a trend toward finer semiconductor devices, the process of using the KrF excimer laser beam (248 nm) is now under a replacement with the process of using the ArF excimer laser beam (193 nm). It is, however, almost impossible to use benzene-ring-containing resins (e.g., the above-mentioned polyhydroxystyrene) in the patterning process using the ArF excimer laser beam, since those resins are insufficient in transparency.

The following two publications disclose examples of the above-mentioned resins. Japanese Patent Laid-open Publication JP-A-4-39665 discloses an acrylic ester resin having a skeletal structure of adamantane in the ester moiety of the molecule. JP-A-8-82925 discloses an acrylic or methacrylic ester resin having a terpenoid skeleton such as menthol.

As a trend toward further finer semiconductor devices, there has been a demand for a process using vacuum ultraviolet laser, particularly $F_2$ excimer laser, which is shorter than ArF excimer laser in wavelength. It is, however, almost impossible to use the above-mentioned resins, for example, polyhydroxystyrene, or a non-fluorine-containing acrylic resins in the patterning process using a vacuum ultraviolet laser such as the $F_2$ excimer laser (157 nm), since those resins are insufficient in transparency. Thus, there is an urgent demand for a novel resist composition that is transparent in a shorter wavelength range of not greater than 157 nm. In connection with this, perfluoro compounds are generally known to have high transparency in this shorter wavelength. These compounds are, however, insoluble in organic solvents generally used in the resist patterning technique. Thus, it is practically impossible to use these compounds for the patterning process using the $F_2$ excimer laser.

SUMMARY OF THE INVENTION

It is therefore an object of the present invention to provide a positive resist composition that is high in transparency to vacuum ultraviolet laser beams, particularly the $F_2$ excimer laser beam, and high in sensitivity and in solubility in organic solvents used in the resist patterning technique.

It is another object of the present invention to provide a process for forming a resist pattern using such composition.

It is still another object of the present invention to provide a process for producing such composition.

According to the present invention, there is provided a positive resist composition for a laser having a wavelength in a vacuum ultraviolet region, said composition comprising (a) an acrylic resin which is subject to a change in solubility in a basic aqueous solution, the acrylic resin comprising an acrylic or methacrylic acid ester unit comprising an ester moiety comprising a fluorine-containing group; and (b) a photoacid generator.

According to the present invention, there is provided a process for forming a resist pattern. This process comprises (1) providing the positive resist composition; (2) applying the composition to a substrate, thereby forming a resist film on the substrate; (3) exposing a portion of the resist film to a radiation of a laser in a vacuum ultraviolet region (1–190 nm); and (4) developing the resist film with the basic aqueous solution by removing the exposed portion of the resist film, thereby forming the resist pattern.

According to the present invention, there is provided a process for producing the positive resist composition. This process comprises (1) polymerizing an acrylic or methacrylic acid ester comprising an ester moiety comprising a fluorine-containing group, thereby obtaining the acrylic resin; and (2) adding the photoacid generator to the acrylic resin.

DESCRIPTION OF THE PREFERRED EMBODIMENTS

Figure 1A:
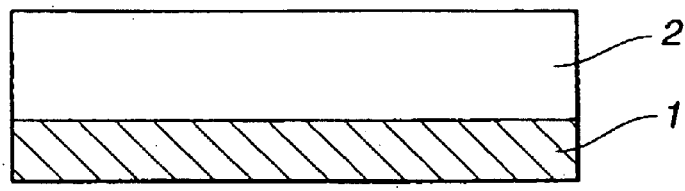
FIGS. 1A to 1D are schematic views showing sequential steps for forming a resist pattern in accordance with Example 10 of the present invention.

The positive resist composition according to the present invention can be high in transparency to vacuum ultraviolet beams, particularly the $F_2$ excimer laser beam, and high in sensitivity and in solubility in organic solvents used in the resist patterning technique, due to that the acrylic resin of the composition is prepared by polymerizing an acrylic or methacrylic acid ester containing an ester moiety or alkoxycarbonyl group (—COOR) having a fluorine-containing group (R), which can be a fully or partially fluorinated group. Therefore, the composition can suitably be used in an ultrafine patterning in the manufacture of semiconductor devices.

Prior to an exposure to a laser (e.g., $F_2$ excimer laser), the acrylic resin of the composition is insoluble or hardly soluble in a basic aqueous solution. When the composition is exposed to a laser, an acid is generated from the photoacid generator. Then, the ester moiety or alkoxycarbonyl group (—COOR) of the acrylic or methacrylic acid ester unit of the acrylic resin is hydrolyzed into carboxylic group (—COOH). With this, the acrylic resin becomes soluble in a basic aqueous solution.

The fluorine-containing group (R) of the ester moiety (—COOR) in the acrylic resin may be (1) a fluorine-containing group that has a carbon atom number of about 1–20 and optionally has a substituent that is a perfluoroalkyl group, a fluoroalkyl group or an alkyl group, or (2) a fluorine-containing group that has a cyclic structure such as a fluorine-containing benzene ring, a fluorine-containing cyclopentane ring, a fluorine-containing cyclohexane ring or a fluorine-containing cycloheptane ring, or (3) a fluorine-containing t-butyl group. Nonlimitative typical examples of the acrylic or methacrylic acid ester containing the above-mentioned fluorine-containing group are 2,2,2-trifluoroethyl acrylate, 2,2,3,3-tetrafluoropropyl acrylate, 1,1,1,3,3,3-hexafluoroisopropyl acrylate, heptafluoroisopropyl acrylate, 1,1-dihydroheptafluoro-n-butyl acrylate, 1,1,5-trihydrooctafluoro-n-pentyl acrylate, 1,1,2,2-tetrahydrotridecafluoro-n-octyl acrylate, 1,1,2,2-tetrahydroheptadecafluoro-n-decyl acrylate, 2,2,2-trifluoroethyl methacrylate, 2,2,3,3-tetrafluoropropyl methacrylate, 1,1,1,3,3,3-hexafluoroisopropyl methacrylate, heptafluoroisopropyl methacrylate, 1,1-dihydroheptafluoro-n-butyl methacrylate, 1,1,5-trihydrooctafluoro-n-pentyl methacrylate, 1,1,2,2-tetrahydrotridecafluoro-n-octyl methacrylate, 1,1,2,2-tetrahydroheptadecafluoro-n-decyl methacrylate, perfluorocyclohexylmethyl acrylate, perfluorocyclohexylmethyl methacrylate, 2-hydroperfluorocyclopentane-methylmethanol acrylate, 2-hydroperfluorocyclopentane-methanol methacrylate, 2-hydroperfluorocyclohexane-methanol acrylate, 2-hydroperfluorocyclohexane-methanol methacrylate, 2-hydroperfluorocyclopentane-α-methylmethanol acrylate, 2-hydroperfluorocyclopentane-α-methylmethanol methacrylate, 2-hydroperfluorocyclohexane-α-methylmethanol acrylate, 2-hydroperfluorocyclohexane-α-methylmethanol methacrylate, 2-hydroperfluorocyclopentane-α, α-dimethylmethanol acrylate, 2-hydroperfluorocyclopentane-α, α-dimethylmethanol methacrylate, 2-hydroperfluorocyclohexane-α, α-dimethylmethanol, acrylate, and 2-hydroperfluorocyclohexane-α, α-dimethylmethanol methacrylate. Of these compounds, it is possible to use a single compound or a mixture of at least two compounds in order to prepare the composition. For the purpose of efficiently changing solubility of the composition in a basic aqueous solution by the action of an acid, it is preferable to use an acrylic or methacrylic acid ester containing an ester moiety having a fluorine-containing isopropyl group. In order to improve dry etching resistance, it is preferable to use an acrylic or methacrylic acid ester containing an ester moiety having a fluorine-containing cyclic structure.

It is possible to use at least one monomer together with the above-mentioned acrylic or methacrylic acid ester for conducting a copolymerization of these monomers to prepare the acrylic resin. This at least one monomer is not particularly limited, so long as it is copolymerizable with the acrylic or methacrylic acid ester. For example, it is possible to use a compound, in which a trifluoromethyl group is directly bonded to a carbon having a polymerizable double bond, such as 3,3,3-trifluoro-2-trifluoromethylpropene (hexafluoroisobutene), hexafluoroacetone or hexafluoropropene, in order to improve the composition in transparency in a vacuum ultraviolet region, which can have a wavelength range of 1–190 nm. Furthermore, it is possible to use a polymerizable compound having four trifluoromethyl groups in the molecule, such as bis(1,1,1,3,3,3-hexafluoroisopropyl)itaconate, or a compound containing α, α-bis(trifluoromethyl)benzyl group.

Furthermore, according to need, it is possible to use in the copolymerization at least one conventional compound generally used in the process for producing conventional acrylic resins. Examples of this at least one conventional compound are (1) acrylic and methacrylic acid alkyl esters such as methyl acrylate or methyl methacrylate (hereinafter expressed as methyl (meth)acrylate), ethyl (meth)acrylate, n-propyl (meth)acrylate, isopropyl (meth)acrylate, n-butyl (meth)acrylate, isobutyl (meth)acrylate, n-hexyl (meth)acrylate, n-octyl (meth)acrylate, 2-ethylhexyl (meth)acrylate, lauryl (meth)acrylate, 2-hydroxyethyl (meth)acrylate, and 2-hydroxypropyl (meth)acrylate; (2) (meth)acrylates containing ethylene glycol, propylene glycol and tetramethylene glycol groups; (3) unsaturated amides such as acrylic amide, methacrylic amide, N-methylol acrylic amide, N-methylol methacrylic amide, diacetone acrylic amide; (4) vinyl esters such as acrylonitrile, methacrylonitrile, styrene, hydroxystyrene, maleic anhydride, and vinyl acetate; (5) vinyl ethers such as vinyl chloride and ethyl vinyl ether; and (6) fluoroolefins such as tetrafluoroethylene and chlorotrifluoroethylene. These exemplary compounds may have halogens (e.g., chlorine and fluorine) partially substituted for hydrogen atoms. Furthermore, it is possible to use a vinyl silane compound, acrylic acid ester or methacrylic acid ester containing alkoxysilyl group.

In order to make the composition have a well balanced combination of dry etching resistance, adhesion to the substrate, uniform applicability of the coating solution and solubility in solvent, the acrylic resin is preferably a homopolymer or copolymer containing at least 30 mol % of the acrylic or methacrylic acid ester unit comprising an ester moiety comprising a fluorine-containing group. In the preparation of the acrylic resin, it is possible to use a (meth)acrylic acid ester having a well-known group capable of improving dry etching resistance, or capable of protecting carboxylic group for preventing dissolution in a basic aqueous solution in the art. Examples of such (meth)acrylic acid ester are t-butyl (meth)acrylate, 3-oxocyclohexyl (meth)acrylate, and adamantyl (meth)acrylate, cyclohexyl (meth)acrylate, and tricyclodecanyl (meth)acrylate. Furthermore, it is possible to use an ethylenic unsaturated carboxylic acid, such as acrylic acid, methacrylic acid, maleic acid and fumaric acid, in order to increase solubility of the acrylic resin in a basic aqueous solution.

In order to obtain the acrylic resin, it is possible to polymerize only the above-mentioned acrylic or methacrylic acid ester containing an ester moiety having a fluorine-containing group or to copolymerize 10–99.9 wt %, preferably 30–99.9 wt %, of this acrylic or methacrylic acid ester and 0.1–90 wt %, preferably 0.1–70 wt %, of the other monomers, based on the total weight of this ester and the other monomers. If this ester is in an amount of less than 10 wt %, the composition may become insufficient in transparency in vacuum ultraviolet region.

The acrylic resin can be obtained by a conventional polymerization (e.g., mass polymerization, solution polymerization, suspension polymerization or emulsion polymerization) in the presence of a radical polymerization initiator or radical initiating source in a batch-wise, half continuous, or continuous manner. The radical polymerization initiator is not particularly limited. Its examples are azo compounds, peroxides and redox compounds. Of these, azobisbutyronitrile, t-butylperoxypivalate and benzoyl peroxide are preferable. A reaction vessel used for the polymerization is not particularly limited.

It is optional to use a polymerization solvent for conducting the polymerization. The polymerization solvent is preferably one that does not interfere with the radical polymerization. Its typical examples are esters such as ethyl acetate and n-butyl acetate; ketones such as acetone and methyl isobutyl ketone; hydrocarbons such as toluene and cyclohexane; and alcohols such as isopropyl alcohol and ethylene glycol monomethyl ether. It is possible to use a single polymerization solvent or a mixture of at least two.

Furthermore, it is possible to use a molecular weight adjusting agent, such as mercaptan, in the polymerization.

The reaction temperature of the polymerization may be adjusted depending on the radical polymerization initiator or radical initiating source. It is preferably from 20 to 200° C., more preferably from 50 to 140° C. After the polymerization, it is possible to remove the medium (i.e., an organic solvent or water) from the reaction product (solution or suspension) containing the acrylic resin, by a conventional method such as (1) reprecipitation followed by filtration or (2) distillation under vacuum. It is preferable that the obtained acrylic resin has a number average molecular weight of 1,000–100,000, more preferably 3,000–50,000.

The photoacid generator used in the resist composition of the invention is not particularly limited. It can arbitrarily be selected from photoacid generators for resists. Its examples are bissulfonyl diazomethanes such as bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane. Further examples are nitrobenzyl derivatives such as 2-nitrobenzyl p-toluenesulfonate and 2,6-dinitrobenzyl p-toluenesulfonate. Further examples are sulfonic acid esters such as pyrogallol trimesylate and pyrogallol tritosylate. Further examples are onium salts such as diphenyliodonium hexafluorophosphate, (4-methoxyphenyl) phenyliodoniumtrifluoromethane sulfonate, bis(p-tert-butylphenyl)iodonium trifluoromethanesulfonate, triphenylsulfonium hexafluorophosphate, (4-methoxyphenyl) diphenylsulfonium trifluoromethanesulfonate, and (p-tert-butylphenyl)diphenylsulfonium trifluoromethanesulfonate. Further examples are benzointosylate and α-methylbenzointoxylate. Further examples are fluorine-containing triazine compounds such as 2-(4-methoxyphenyl)-4,6-(bistrichloromethyl)-1,3,5-triazine, 2-(4-methoxynaphtyl)-4,6-(bistrichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, 2,4,6-tris(2,3-dibromopropyl)-1,3,5-triazine, and tris(2,3-dibromopropyl)isocyanurate. Further examples are cyano-group-containing oxime sulfonates, which are disclosed in JP-A-60-65072 corresponding to U.S. Pat. No. 4,540,598, such as α-(p-toluenesulfonyloxyimino)-benzylcyanide, α-(p-chlorobenzenesulfonylimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thiene-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl] acetonitrile, and α-(tosyloxyimino)-4-thienylcyanide. Furthermore, examples of other oxime sulfonates are α-(methylsulfonyloxymino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylactonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile. Further examples are α-(methylsulfonyloxyimino)phenylacetonitrile, α-(methylsulfonyloxyimino)-4-methoxyphenylacetonitrile, α-(trifluoromethylsulfonyloxyimino)phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methylphenylacetonitrile, and α-(methylsulfonyloxyimino)-4-bromophenylacetonitrile. Of the above-mentioned examples of the photoacid generator, onium salts and cyano-group-containing oxime sulfonates are preferable. It is possible to use a single compound or a mixture of at least two compounds as the photoacid generator. The amount of the photoacid generator may be in a range of 0.5–20 parts by weight per 100 parts by weight of the acrylic resin. If it is less than 0.5 parts by weight, the image formability may become insufficient in the patterning process. If it is greater than 20 parts by weight, it may become difficult to form a uniform solution of the composition. Thus, the solution may become unstable during storage. In case of a chemically amplified resist composition, the amount of the photoacid generator can be reduced.

It is preferable to dissolve the composition in a solvent, thereby preparing a solution for the application to a substrate. Examples of such solvent are ketones such as acetone, methyl ethyl ketone, cyclohexanone, methyl isoamyl ketone and 2-heptanone; polyhydric alcohols and their derivatives such as ethylene glycol, ethylene glycol monoacetate, diethylene glycol, diethylene glycol monoacetate, propylene glycol, propylene glycol monoacetate, dipropylene glycol, and ethers (e.g., monomethyl ether, monoethyl ether, monopropyl ether, monobutyl ether and monophenyl ether) of dipropylene glycol monoacetate; cyclic ethers such as dioxane; esters such as methyl lactate, ethyl lactate, methyl acetate, ethyl acetate, butyl acetate, methyl pyruvate, ethyl pyruvate, methyl methoxypropionate, and ethyl ethoxypropionate; aromatic solvents such as xylene and toluene; and fluorine-containing solvents such as Freon (chlorofluorocarbons), alternate Freon, perfluoro compounds and hexafluoroisopropyl alcohol. Furthermore, it is possible to use a weak solvent of high boiling point, such as turpentine-based petroleum naphtha solvents and paraffinic solvents, in order to improve applicability of the solution. It is possible to use a single solvent or a mixture of at least two solvents. According to need, it is optional to add a miscible additive(s) to the composition, such as additional resins, quencher, plasticizer, stabilizer, coloring agent, surfactant, thickener, leveling agent, defoaming agent, an agent for increasing compatibility, an agent for increasing adhesion, and antioxidant.

The resist composition of the invention can suitably be used for an irradiation with an exposure light in a vacuum ultraviolet region (wavelength: 1–190 nm) such as $Xe_2$ excimer laser, $F_2$ excimer laser, $Kr_2$ excimer laser, ArKr excimer laser, $Ar_2$ excimer laser and soft X-ray, particularly $F_2$ excimer laser. It is possible to use the resist composition in conventional processes for forming a resist pattern. It is possible to obtain a resist pattern in conformity with a mask pattern from the resist composition by a process comprising the sequential steps of (a) applying a solution of the resist composition to a substrate (e.g., silicon wafer) by spin coating, followed by drying, thereby forming a resist film on the substrate; (b) exposing a portion of the resist film to an excimer laser (e.g., $F_2$ excimer laser) with an interposal of a mask having a desired mask pattern; (c) heating the coated substrate; and (d) developing the resist film with a basic aqueous solution (e.g., 0.1–10 wt % tetramethylammonium hydroxide aqueous solution) to remove the exposed portion of the resist film, thereby forming the resist pattern.

The following nonlimitative examples are illustrative of the present invention.

EXAMPLE 1

At first, a 100-mL stainless steel reaction vessel was charged with 16.5 g of 2,2,2-trifluoroethyl methacrylate (3FMA), 2.7 g of t-butyl methacrylate (t-BuMA), 0.8 g of 2-hydroxyethyl methacrylate (HEMA), 0.11 g of t-butyl peroxypivalate (t-BuPPV), and 30 g of butyl acetate. Then, the gas atmosphere in the vessel was replaced by nitrogen gas, and this operation was repeated three times. After that, the vessel was tightly sealed and put in a thermostat water bath of 60° C., thereby conducting a polymerization for 20 hr. After the polymerization, the content of the vessel was introduced into a large amount of hexane, thereby obtaining a solid matter precipitated therein. Then, the solid matter was dissolved in acetone and then reprecipitated in hexane, thereby obtaining 14 g of a purified polymer. The purified polymer was found to have a number average molecular weight (Mn) of 32,000 and a weight average molecular weight (Mw) of 60,000 by gel permeation chromatography using polystyrene as a standard material and tetrahydrofuran (THF) as a solvent.

The solubility of the purified polymer was judged to be good, if the purified polymer of 5 g or more is dissolved at room temperature in 100 g of either one of propylene glycol monomethylether acetate, diethylene glycol dimethyl ether and cyclohexanone butyl acetate. It was judged to be not good, if it is not dissolved in each one of these solvents. The result is shown in Table.

The purified polymer was formed into a film (thickness: 100 nm). Then, the transparency of this film to a wavelength of 157 nm was measured using a vacuum ultraviolet spectrometer. The result is shown in Table.

EXAMPLES 2–9 AND COMPARATIVE EXAMPLE

In these examples and comparative example, Example 1 was repeated except that the types and the amounts of the monomers and the amounts of the polymerization initiator and the solvent were respectively changed as shown in Table.

TABLE

|  | Ex. 1 | Ex. 2 | Ex. 3 | Ex. 4 | Ex. 5 | Ex. 6 | Ex. 7 | Ex. 8 | Ex. 9 | Com. Ex. |
|---|---|---|---|---|---|---|---|---|---|---|
| 3FMA | 16.5 g | — | — | — | — | — | — | — | — | — |
| 6FIPMA* | — | 20.0 g | 7.8 g | 8.5 g | — | — | — | 4.0 g | 6.5 g | — |
| 6FIPA* | — | — | — | 0.7 g | — | — | 12.0 g | — | — | — |
| 7FMA* | — | — | — | — | 5.0 g | — | — | — | — | — |
| 17FMA* | — | — | — | — | — | 5.0 g | — | — | — | — |
| HFIB* | — | — | — | — | — | — | 6.0 g | — | — | — |
| bis-6FIP-I* | — | — | — | — | — | — | — | 4.0 g | — | — |
| 6FCMA* | — | — | — | — | — | — | — | — | 3.3 g | — |
| t-BuMA | 2.7 g | — | 0.8 g | 0.6 g | 4.4 g | 2.2 g | — | — | — | — |
| t-BuA* | — | — | — | — | — | — | 6.5 g | — | — | — |
| CHMA* | — | — | 0.8 g | — | — | — | — | 2.0 g | — | — |
| ADMA* | — | — | — | — | — | 2.2 g | — | — | — | — |
| HEMA | 0.8 g | — | 0.4 g | — | 0.4 g | 0.4 g | — | — | — | — |
| MAA* | — | — | 0.2 g | 0.2 g | 0.2 g | 0.2 g | — | — | 0.2 g | — |
| AA* | — | — | — | — | — | — | 0.5 g | — | — | — |
| MMA* | — | — | — | — | — | — | — | — | — | 20.0 g |
| t-BuPPV | 0.11 g | 0.07 g | 0.04 g | 0.04 g | 0.05 g | 0.04 g | 0.13 g | 0.03 g | 0.04 g | 0.17 g |
| Butyl Acetate | 30 g | 30 g | 40 g | 40 g | 40 g | 40 g | 25 g | 40 g | 40 g | 30 g |
| Yield | 14 g | 15 g | 7 g | 7 g | 7 g | 8 g | 17 g | 6 g | 7 g | 16 g |
| Molecular Weight (Mn/Mw, × 1,000) | 32/60 | 26/41 | 24/40 | 28/51 | 24/41 | 30/62 | 5/11 | 13/28 | 26/52 | 25/48 |
| Solubility | Good | Good | Good | Good | Good | Good | Good | Good | Good | Good |
| Transparency in 157 nm | 60% | 66% | 53% | 61% | 55% | 62% | 68% | 62% | 51% | 20% |

*6FIPMA: 1,1,1,3,3,3-hexafluoroisopropyl methacrylate; 6FIPA: 1,1,1,3,3,3-hexafluoroisopropyl acrylate; 7FMA: heptafluoroisopropyl methacrylate; 17FMA: 1,1,2,2-tetrahydroheptadecafluoro-n-decyl methacrylate; HFIB: 3,3,3-trifluoro-2-trifluoromethyl propene; bis-6FIP-I: bis(1,1,1,3,3,3-hexafluoroisopropyl)itaconate; 6FCMA: α,α-bis(trifluoromethyl)benzyl methacrylate; t-BuA: t-butyl acrylate; CHMA: cyclohexyl methacrylate; ADMA: adamantyl methacrylate; MAA: methacrylic acid; AA: acrylic acid; and MMA: methyl methacrylate.

EXAMPLE 10

At first, a fluorine-containing acrylic resin (positive resist composition) obtained in Example 3 was dissolved in propylene glycol monomethyl ether acetate, thereby preparing a solution containing 8 wt % of this resin. Then, to the solution triphenyl sulfonium triflate (photoacid generator), TPS105 (trade name) of Midori Chemical Co., was added in an amount of 1 part by weight per 100 parts by weight of the fluorine-containing acrylic resin, thereby preparing a resist solution.

Figure 1B:
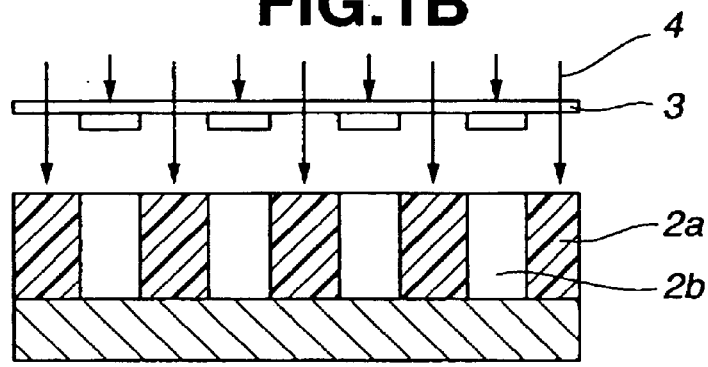
Figure 1C:
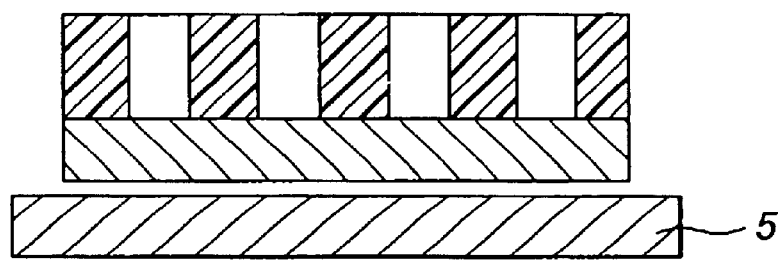
Figure 1D:
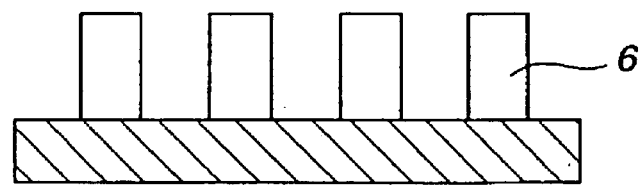

Then, as shown in FIG. 1A, the resist solution was Applied to a semiconductor substrate 1 by spin coating, followed by a pre-baking at 110° C. for 60 seconds, thereby obtaining a resist film 2 having a thickness of 300 nm. The obtained resist film is hardly soluble in basic solutions, since the acrylic resin used in this film is so. Then, as shown in FIG. 1B, the resist film 2 was irradiated with a $F_2$ excimer laser beam 4 of 157 nm with an interposal of a mask 3 having a desired pattern. Then, as shown in FIG. 1C, a laminate of the semiconductor substrate 1 and the resist film 2 was heated at 110° C. for 60 seconds by a hot plate 5. With this, the exposed portions, 2a of the resist film 2 become soluble in basic developing solutions, since an acid is generated from the photoacid generator in the exposed portions 2a and since the resin of the exposed portions 2a is decomposed by this acid. In contrast, the unexposed portions 2b of the resist film 2 are still hardly soluble in basic developing solutions. After the heating, the resist film 2 was developed with a 2.38 wt % tetramethylammonium hydroxide aqueous solution for 60 seconds, followed by a washing with water for 30 seconds. With this, only the exposed portions 2a of the resist film 2 were developed, thereby obtaining a resist pattern 6 (line width: 0.20 $\mu$m) of the unexposed portions 2b each having a rectangular section (see FIG. 1D).

The entire disclosure of Japanese Patent-Application No. 11-338701 filed on Nov. 29, 1999, including specification, drawings, claims and summary, is incorporated herein by reference in its entirety.

What is claimed is:

1. A positive resist composition for a laser having a wavelength in a vacuum ultraviolet region, said composition comprising:
    (a) an acrylic resin which is subject to a change in solubility in a basic aqueous solution, said acrylic resin comprising an acrylic or methacrylic acid ester unit comprising an ester moiety comprising a hexafluoroisopropyl group; and
    (b) a photoacid generator.

2. A positive resist composition for a laser having a wavelength in a vacuum ultraviolet region, said composition comprising:
    (a) an acrylic resin which is subject to a change in solubility in a basic aqueous solution, said acrylic resin comprising an acrylic or methacrylic acid ester unit comprising an ester moiety comprising a heptafluoroisopropyl group; and
    (b) a photoacid generator.

3. A positive resist composition for a laser having a wavelength in a vacuum ultraviolet region, said composition comprising:
    (a) an acrylic resin which is subject to a change in solubility in a basic aqueous solution, said acrylic resin comprising an acrylic or methacrylic acid ester unit comprising an ester moiety comprising a fluorine-containing cyclic structure, said cyclic structure is one selected from the group consisting of benzene ring, cyclopentane ring, cyclohexane ring, and cycloheptane ring; and
    (b) a photoacid generator.

4. A positive resist composition for a laser having a wavelength in a vacuum ultraviolet region, said composition comprising:
    (a) an acrylic resin which is subject to a change in solubility in a basic aqueous solution, said acrylic resin comprising an acrylic or methacrylic acid ester unit comprising an ester moiety comprising a fluorine-containing group; and
    (b) a photoacid generator;
    wherein said acrylic resin further comprises a monomeric unit derived from a compound comprising a polymerizable double bond and a trifluoromethyl group directly bonded to a carbon having said polymerizable double bond.

5. A positive resist composition for a laser having a wavelength in a vacuum ultraviolet region, said composition comprising:
    (a) an acrylic resin which is subject to a change in solubility in a basic aqueous solution, said acrylic resin comprising an acrylic or methacrylic acid ester unit comprising an ester moiety comprising a fluorine-containing group; and
    (b) a photoacid generator;
    wherein said acrylic resin further comprises a monomeric unit derived from bis(1,1,1,3,3,3-hexafluoroisopropyl) itaconate.

6. A positive resist composition for a laser having a wavelength in a vacuum ultraviolet region, said composition comprising:
    (a) an acrylic resin which is subject to a change in solubility in a basic aqueous solution, said acrylic resin comprising an acrylic or methacrylic acid ester unit comprising an ester moiety comprising a fluorine-containing group; and
    (b) a photoacid generator;
    wherein said acrylic resin further comprises a monomeric unit derived from an acrylic or methacrylic acid ester comprising $\alpha$, $\alpha$-bis(trifluoromethyl)benzyl group.

7. A process for forming a resist pattern, comprising:
    providing a positive resist composition comprising:
        (a) an acrylic resin which is subject to a change in solubility in a basic aqueous solution, said acrylic resin comprising an acrylic or methacrylic acid ester unit comprising an ester moiety comprising a fluorine-containing group; and
        (b) a photoacid generator;
    applying said composition to a substrate, thereby forming a resist film on said substrate;
    exposing a portion of said resist film to a radiation of a laser in a vacuum ultraviolet region of 1–190 nm; and
    developing said resist film with said basic aqueous solution by removing the exposed portion of said resist film, thereby forming the resist pattern.

8. A process according to claim 7, wherein said laser is one selected from the group consisting of $Xe_2$ excimer laser, $F_2$ excimer laser, $Kr_2$ excimer laser, ArKr excimer laser, $Ar_2$ excimer laser, and soft X-ray laser.

9. A process according to claim 8, wherein said laser is an $F_2$ excimer laser.

10. A process for producing a positive resist composition, comprising:
    (a) an acrylic resin which is subject to a change in solubility in a basic aqueous solution, said acrylic resin comprising an acrylic or methacrylic acid ester unit comprising an ester moiety comprising a fluorine-containing group; and (b) a photoacid generator, said process comprising:
polymerizing an acrylic or methacrylic acid ester comprising an ester moiety comprising a fluorine-containing group, thereby obtaining said acrylic resin; and
adding said photoacid generator to said acrylic resin;
wherein said polymerizing is conducted in the presence of t-butylperoxypivalate.

11. A process for producing a positive resist composition, comprising:
(a) an acrylic resin which is subject to a change in solubility in a basic aqueous solution, said acrylic resin comprising an acrylic or methacrylic acid ester unit comprising an ester moiety comprising a fluorine-containing group; and
(b) a photoacid generator, said process comprising:
polymerizing an acrylic or methacrylic acid ester comprising an ester moiety comprising a fluorine-containing group, thereby obtaining said acrylic resin; and
adding said photoacid generator to said acrylic resin;
wherein said polymerizing is conducted by copolymerizing said acrylic or methacrylic acid ester and at least one monomer, said at least one monomer being selected from the group consisting of (1) a compound comprising a polymerizable double bond and a trifluoromethyl group directly bonded to a carbon having said double bond, wherein said compound is selected from the group consisting of 3,3,3-trifluoro-2-trifluoromethylpropene, hexafluoroacetone, and hexafluoropropene, (2) bis(1,1,1,3,3,3-hexafluoroisopropyl)itaconate, (3) an acrylic or methacrylic acid ester comprising α, α-bis(trifluoromethyl)benzyl group, (4) t-butyl methacrylate, (5) t-butyl acrylate, (6) cyclohexylmethacrylate, (7) adamantyl methacrylate, (8) 2-hydroxyethyl methacrylate, (9) methacrylic acid, and (10) acrylic acid.

12. A positive resist composition for a laser having a wavelength in a vacuum ultraviolet region, said composition comprising:
(a) a fluorine-containing acrylic resin which is subject to a change in solubility in a basic aqueous solution, said acrylic resin being a copolymer and comprising:
(1) a first acrylic or methacrylic acid ester unit comprising an ester moiety comprising a fluorine-containing group; and
(2) a second acrylic or methacrylic acid ester unit comprising a group capable of protecting carboxylic group for preventing dissolution in a basic aqueous solution, wherein said group is contained in an ester moiety of said second acrylic or methacrylic acid ester and is subject to a change in solubility in a basic aqueous solution by an action of an acid; and
(b) a photoacid generator.

13. A composition according to claim 12, wherein said acrylic resin comprises (1) 10–99.9 wt % of said first acrylic or methacrylic acid ester and (2) 0.1–90 wt % of said second acrylic or methacrylic acid ester.

14. A composition according to claim 12, wherein said fluorine-containing group is a fluorine-containing alkyl group.

15. A composition according to claim 12, wherein said fluorine-containing group is a fluorine-containing alkyl group having a carbon atom number of 1–20.

16. A composition according to claim 12, wherein said fluorine-containing group is a hexafluoroisopropyl group.

17. A composition according to claim 12, wherein said fluorine-containing group is a heptafluoroisopropyl group.

18. A composition according to claim 12, wherein said fluorine-containing group comprises a fluorine-containing cyclic structure.

19. A composition according to claim 18, wherein said cyclic structure is one selected from the group consisting of benzene ring, cyclopentane ring, cyclohexane ring, and cycloheptane ring.

20. A composition according to claim 12, wherein said acrylic resin further comprises a monomeric unit derived from a compound comprising a polymerizable double bond and a trifluoromethyl group directly bonded to a carbon having said polymerizable double bond.

21. A composition according to claim 12, wherein said group is one selected from the group consisting of t-butyl group, oxocyclohexyl group, adamantyl group, cyclohexyl group, and tricyclodecanyl group.

22. A composition according to claim 12, wherein said acrylic resin further comprises a monomeric unit derived from bis(1,1,1,3,3,3-hexafluoroisopropyl)itaconate.

23. A composition according to claim 12, wherein said acrylic resin further comprises a monomeric unit derived from an acrylic or methacrylic acid ester comprising α, α-bis(trifluoromethyl)benzyl group.

24. A composition according to claim 12, further comprising a solvent.

25. A composition according to claim 12, wherein said laser is one selected from the group consisting of $Xe_2$ excimer laser, $F_2$ excimer laser, $Kr_2$ excimer laser, ArKr excimer laser, $Ar_2$ excimer laser, and soft X-ray laser.

26. A composition according to claim 12, wherein said laser is an $F_2$ excimer laser.

27. A composition according to claim 12, wherein said acrylic resin comprises at least 30 mol % of said acrylic or methacrylic acid ester unit.

28. A composition according to claim 12, wherein said acrylic resin has a number average molecular weight of 1,000–100,000.

29. A composition according to claim 12, wherein said photoacid generator is in an amount of 0.5–20 parts by weight per 100 parts by weight of said acrylic resin.

30. A process for forming a resist pattern, comprising:
providing a positive resist composition comprising:
(a) a fluorine-containing acrylic resin which is subject to a change in solubility in a basic aqueous solution, said acrylic resin being a copolymer and comprising:
(1) a first acrylic or methacrylic acid ester unit comprising an ester moiety comprising a fluorine-containing group; and
(2) a second acrylic or methacrylic acid ester unit comprising a group capable of protecting carboxylic group for preventing dissolution in a basic aqueous solution; wherein said group is contained in an ester moiety of said second acrylic or methacrylic acid ester and is subject to a change in solubility in a basic solution by an action of an acid and
(b) a photoacid generator,
applying said composition to a substrate, thereby forming a resist film on said substrate;
exposing a portion of said resist film to a radiation of a laser in a vacuum ultraviolet region of 1–190 nm; and developing said resist film with said basic aqueous solution by removing the exposed portion of said resist film, thereby forming the resist pattern.

31. A process according to claim 30, wherein said laser is one selected from the group consisting of $Xe_2$ excimer laser, $F_2$ excimer laser, $Kr_2$ excimer laser, ArKr excimer laser, $Ar_2$ excimer laser, and soft X-ray laser.

32. A process according to claim 31, wherein said laser is an $F_2$ excimer laser.

33. A process for producing a positive resist composition, said composition comprising:
   (a) a fluorine-containing acrylic resin which is subject to a change in solubility in a basic aqueous solution, said acrylic resin being a copolymer and comprising:
      (1) a first acrylic or methacrylic acid ester unit comprising an ester moiety comprising a fluorine-containing group; and
      (2) a second acrylic or methacrylic acid ester unit comprising a group capable of protecting carboxylic group for preventing dissolution in a basic aqueous solution, wherein said group is contained in an ester moiety of said second acrylic or methacrylic acid ester and is subject to a change in solubility in a basic aqueous solution by an action of an acid; and
   (b) a photoacid generator, said process comprising:
      copolymerizing the first acrylic or methacrylic acid ester with the second acrylic or methacrylic acid ester, thereby obtaining said acrylic resin; and
      adding said photoacid generator to said acrylic resin.

34. A process according to claim 33, wherein said copolymerizing is conducted in the presence of a radical polymerization initiator or a radical initiating source.

35. A process according to claim 34, wherein said copolymerizing is conducted in the presence of t-butylperoxypivalate as said radical polymerization initiator.

36. A process according to claim 33, wherein said copolymerizing is conducted at a temperature of 20–200° C.

37. A process according to claim 33, wherein said photoacid generator is in an amount of 0.5–20 parts by weight per 100 parts by weight of said acrylic resin.

38. A process according to claim 33, wherein said second acrylic or methacrylic acid ester is selected from the group consisting of t-butyl methacrylate, t-butyl acrylate, cyclohexylmethacrylate, and adamantyl methacrylate.

39. A composition according to claim 12, which is a chemically amplified positive resist composition.

* * * * *